(12) United States Patent
Hurwitz et al.

(10) Patent No.: US 7,541,231 B1
(45) Date of Patent: *Jun. 2, 2009

(54) INTEGRATION OF SIGE NPN AND VERTICAL PNP DEVICES ON A SUBSTRATE

(75) Inventors: Paul D. Hurwitz, Irvine, CA (US); Kenneth M. Ring, Tustin, CA (US); Chun Hu, Irvine, CA (US); Amol Kalburge, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 564 days.

This patent is subject to a terminal disclaimer.

(21) Appl. No.: 11/084,391

(22) Filed: Mar. 17, 2005

Related U.S. Application Data

(63) Continuation of application No. 10/821,425, filed on Apr. 9, 2004, now Pat. No. 6,933,202.

(51) Int. Cl.
  H01L 21/338 (2006.01)
  H01L 31/0328 (2006.01)
  H01L 31/0336 (2006.01)
  H01L 31/072 (2006.01)
  H01L 31/109 (2006.01)

(52) U.S. Cl. .................. 438/170; 257/197; 257/565; 257/552

(58) Field of Classification Search .............. 438/170; 257/192, 588, 194, 198, 197, 593, 511, 565, 257/578

See application file for complete search history.

(56) References Cited

U.S. PATENT DOCUMENTS 6,933,202 B1 * 8/2005 Hurwitz et al. ............ 438/322

2003/0219952 A1 11/2003 Fujimaki et al
2004/0099895 A1 5/2004 Gray et al.

OTHER PUBLICATIONS

Baudry, et al. *BiCMOS7RF: A Highly-Manufacturable 0.25-/spl mu/m BiCOMOS RF-Applications-Dedicated Technology Using Non Selective SiGe: C Epitaxy*, Proceedings of the 2003 Bipolar/BiCMOS Circuits and Technology Meeting, Toulouse, France, IEEE BCTM 11.3; pp. 207-210 (Sep. 2003).

Baudry, et al. *High Performance 0.25/spl mu/m SiGe and SiGe: C HBTs Using Non Selective Epitaxy*, Proceedings of the 2001 Bipolar/BiCMOS Circuits and Technology Meeting, Minneapolis, MN, IEEE BCTM 3.1; pp. 52-55 (Sep. 2001).

* cited by examiner

Primary Examiner—Chuong A. Luu
(74) Attorney, Agent, or Firm—Farjami & Farjami LLP

(57) ABSTRACT

According to one exemplary embodiment, a method for forming an NPN and a vertical PNP device on a substrate comprises forming an insulating layer over an NPN region and a PNP region of the substrate. The method further comprises forming a buffer layer on the insulating layer and forming an opening in the buffer layer and the insulating layer in the NPN region, where the opening exposes the substrate. The method further comprises forming a semiconductor layer on the buffer layer and in the opening in the NPN region, where the semiconductor layer has a first portion situated in the opening and a second portion situated on the buffer layer in the PNP region. The first portion of the semiconductor layer forms a single crystal base of the NPN device and the second portion of the semiconductor layer forms a polycrystalline emitter of the vertical PNP device.

17 Claims, 8 Drawing Sheets

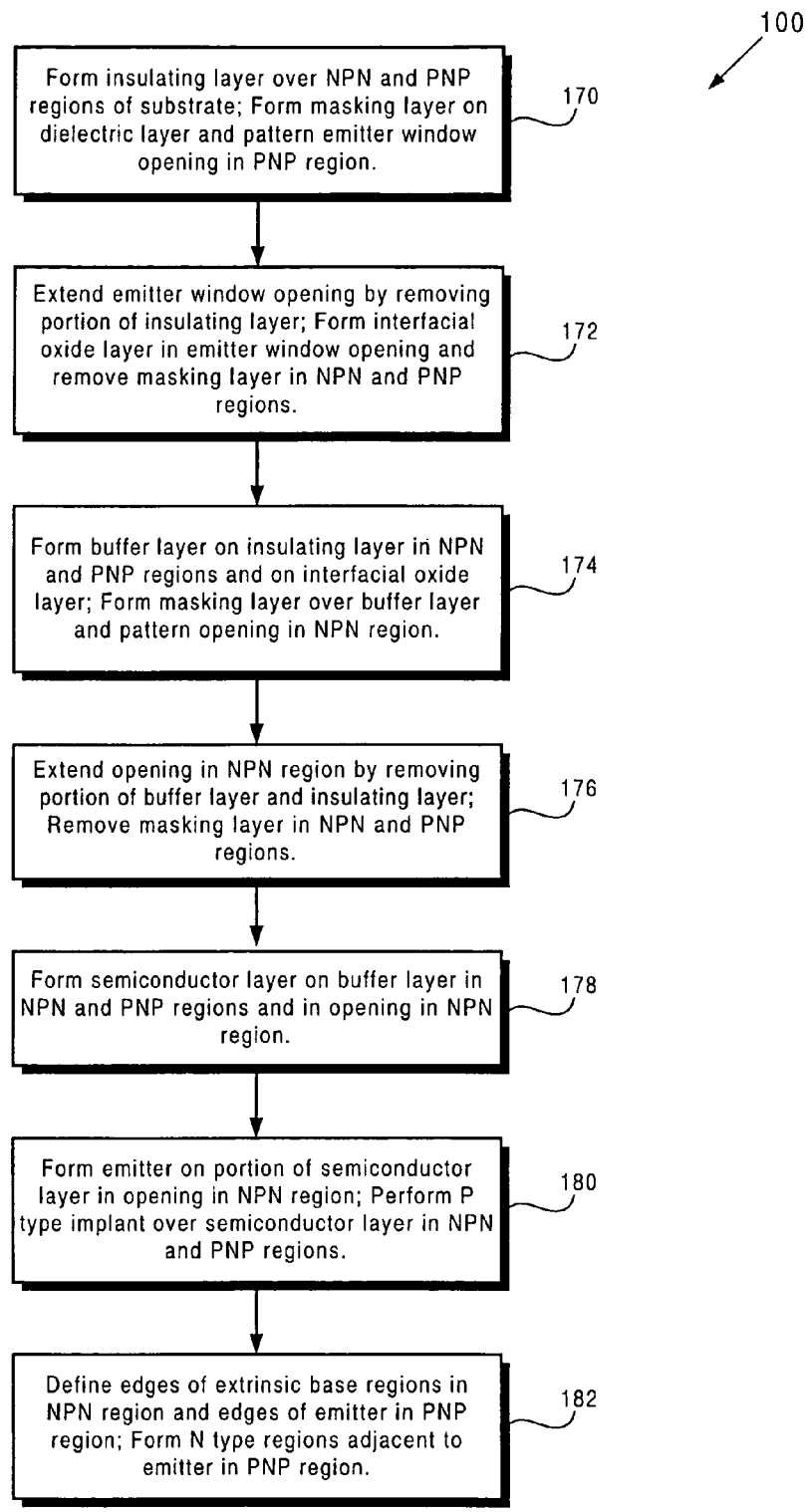

INTEGRATION OF SIGE NPN AND VERTICAL PNP DEVICES ON A SUBSTRATE

This is a continuation of application Ser. No. 10/821,425 filed Apr. 9, 2004 now U.S. Pat. No. 6,933,202.

BACKGROUND OF THE INVENTION

1. Field of the Invention

The present invention relates to the field of fabrication of semiconductor devices. More specifically, the invention relates to forming bipolar transistors.

2. Background Art

Increasing demand for higher-performing analog circuits, such as high speed, low noise amplifiers, provides an impetus for continued improvements in complementary bipolar technology. In complementary bipolar technology, PNP and NPN devices can be integrated on the same substrate of a semiconductor die in a complementary bipolar process. However, semiconductor manufacturers are challenged to provide a complementary bipolar process that effectively integrates higher-performing PNP and NPN devices.

In one approach, a lateral PNP device has been integrated with a silicon-germanium ("SiGe") NPN device in a complementary bipolar process. However, in a lateral PNP implementation, the base width of the PNP device, which is defined by two mask edges, is difficult to control, which negatively affects the performance of the lateral PNP device. In contrast to a lateral PNP device, a vertical PNP device has a base width that is defined by base implant depth, which is easier to control than the alignment of the mask edges utilized to define base width in the lateral PNP device. As a result, the base in the vertical PNP device can be made narrower than the base in the lateral PNP device, which enables a vertical PNP device to have a larger current gain than a lateral PNP device. For example, a vertical PNP device can achieve a current gain of between approximately 50 and approximately 100, while a lateral PNP device can only achieve a current gain of approximately 15.

Thus, in order to achieve increased performance, it is desirable to provide a complementary process that integrates an NPN device, such as a SiGe NPN device, and a vertical PNP device. However, integrating a vertical PNP device and an NPN device, such as a SiGe NPN device, in the complementary bipolar process undesirably increases processing complexity and manufacturing cost.

Thus, there is a need in the art for a complementary bipolar process for effectively integrating a vertical PNP device and an NPN device, such as a SiGe NPN device, without undesirably increasing processing complexity and manufacturing cost.

SUMMARY OF THE INVENTION

The present invention is directed to method for integrating SiGe NPN and vertical PNP devices on a substrate and related structure. The present invention addresses and resolves the need in the art for a complementary bipolar process for effectively integrating a vertical PNP device and an NPN device, such as a SiGe NPN device, without undesirably increasing processing complexity and manufacturing cost.

According to one exemplary embodiment, a method for forming an NPN device and a vertical PNP device on a substrate comprises a step forming an insulating layer over an NPN region and a PNP region of the substrate. The insulating layer may comprise TEOS oxide, for example. The method further comprises forming an emitter window opening in the insulating layer in the PNP region. The method further comprises forming a buffer layer on the insulating layer. For example, the buffer layer may be amorphous silicon. The method further comprises forming an opening in the buffer layer and the insulating layer in the NPN region, where the opening exposes the substrate.

According to this exemplary embodiment, the method further comprises forming a semiconductor layer on the buffer layer and in the opening in the NPN region, where the semiconductor layer has a first portion situated in the opening in the NPN region and a second portion situated on the buffer layer in the PNP region. The semiconductor layer can comprise silicon-germanium. The first portion of the semiconductor layer forms a single crystal base of the NPN device and the second portion of the semiconductor layer forms a polycrystalline emitter of the vertical PNP device. The method further comprises forming an emitter of the NPN device over the single crystal base. The method further comprises the steps of forming extrinsic base regions of the NPN device in the semiconductor layer and simultaneously defining edges of the extrinsic base regions and edges of the polycrystalline emitter of the vertical PNP device.

According to one embodiment, the invention is a structure that is achieved by the above-described method. Other features and advantages of the present invention will become more readily apparent to those of ordinary skill in the art after reviewing the following detailed description and accompanying drawings.

BRIEF DESCRIPTION OF THE DRAWINGS

FIG. 1 shows a flowchart illustrating the steps taken to implement an embodiment of the present invention.

DETAILED DESCRIPTION OF THE INVENTION

Figure 2A:
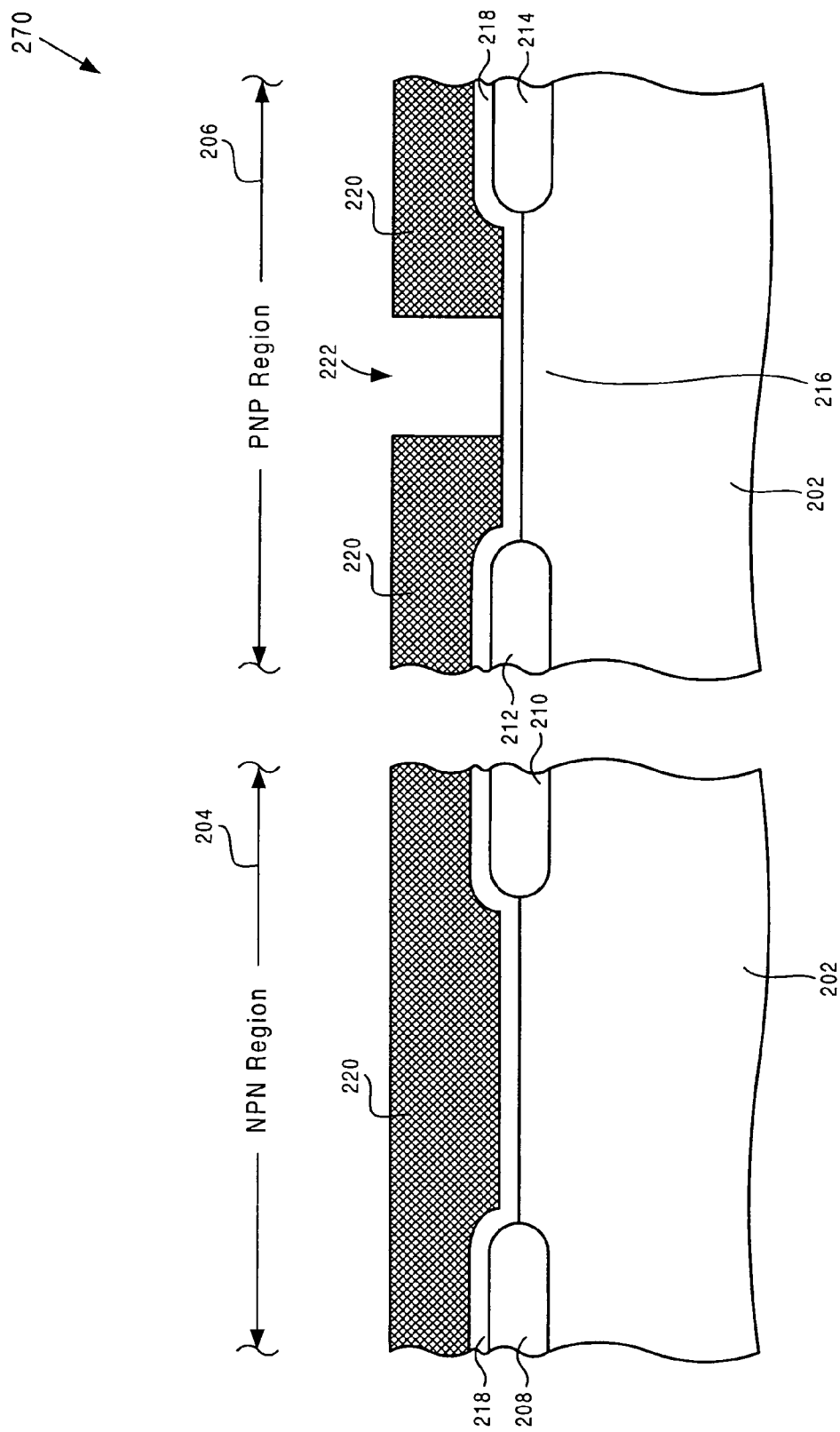
FIG. 2A illustrates cross-sectional views, which include portions of a wafer processed according to an embodiment of the invention, corresponding to certain steps of the flowchart in FIG. 1.

The present invention is directed to method for integrating SiGe NPN and vertical PNP devices on a substrate and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

The present invention involves a method of integrating a SiGe NPN device and a vertical PNP device in a complementary bipolar process. As will be discussed in detail below, by providing a buffer layer over NPN and PNP regions of a substrate, the present invention advantageously achieves a single crystal base of a SiGe NPN device and a polycrystalline emitter of a vertical PNP device by depositing a semiconductor layer comprising silicon-germanium. The innovative method of the present invention can be applied in, for example, BiCMOS applications to achieve effective integration of SiGe NPN and lateral PNP devices and CMOS devices on a semiconductor substrate.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 182 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 170, includes a silicon substrate having NPN and PNP regions, where the NPN region of the silicon substrate includes field oxide regions and a collector (not shown in any of the figures), and the PNP region of the silicon substrate includes field oxide regions, a base, and a collector (not shown in any of the figures). It is also noted that, prior to step 170, the silicon substrate can also include a complementary metal-oxide semiconductor ("CMOS") region (not shown in any of the figures), which can include CMOS devices.

Moreover, structures 270 through 282 in FIGS. 2A through 2G illustrate the result of performing, on the semiconductor structure discussed above, steps 170 through 182 of flowchart 100, respectively. For example, structure 270 shows the semiconductor structure discussed above after processing step 170, structure 272 shows structure 270 after the processing of step 172, structure 274 shows structure 272 after the processing of step 174, and so forth. It is noted that although formation of only one NPN device and only one PNP device are specifically discussed herein to preserve brevity, multiple NPN and PNP devices can be formed in respective NPN and PNP regions of a silicon substrate utilizing the innovative process of the present invention.

Referring now to FIG. 2A, structure 270 of FIG. 2A shows an exemplary structure including a silicon substrate that includes NPN and PNP regions, after completion of step 170 of flowchart 100 in FIG. 1. In structure 270, field oxide regions 208 and 210 are formed in NPN region 204 of substrate 202, which is a silicon substrate, and field oxide regions 212 and 214 are formed in PNP region 206 of substrate 202. Field oxide regions 208, 210, 212, and 214 can comprise silicon oxide and may be formed in substrate 202 in a manner known in the art. PNP region 206 also includes base 216, which forms a base of a nascent vertical PNP device. Base 216 is situated between field oxide regions 212 and 214 in PNP region 206 and can be formed by doping the portion of substrate 202 situated between field oxide regions 212 and 214 with an appropriate N type dopant.

Continuing with step 170 in FIG. 1 and structure 270 in FIG. 2A, at step 170 of flowchart 100, insulating layer 218 is formed over NPN region 204 and PNP region 206 of substrate 202. Insulating layer 218 can comprise tetraethylorthosilicate ("TEOS") oxide and can be formed over NPN region 204 and PNP region 206 of substrate 202 by using a chemical vapor deposition ("CVD") process or other appropriate processes. By way of example, insulating layer 218 can have a thickness of approximately 500.0 Angstroms.

Also at step 170 of flowchart 100, masking layer 220 is formed on insulating layer 218 in NPN region 204 and PNP region 206 and emitter window opening 222 is patterned in masking layer 220 in PNP region 206. Masking layer 220, which protects NPN region 204, can comprise photoresist or other masking material and can be appropriately patterned to form emitter window opening 222, which is situated over base 216 in PNP region 206. The result of step 170 of flowchart 100 is illustrated by structure 270 in FIG. 2A.

Figure 2B:
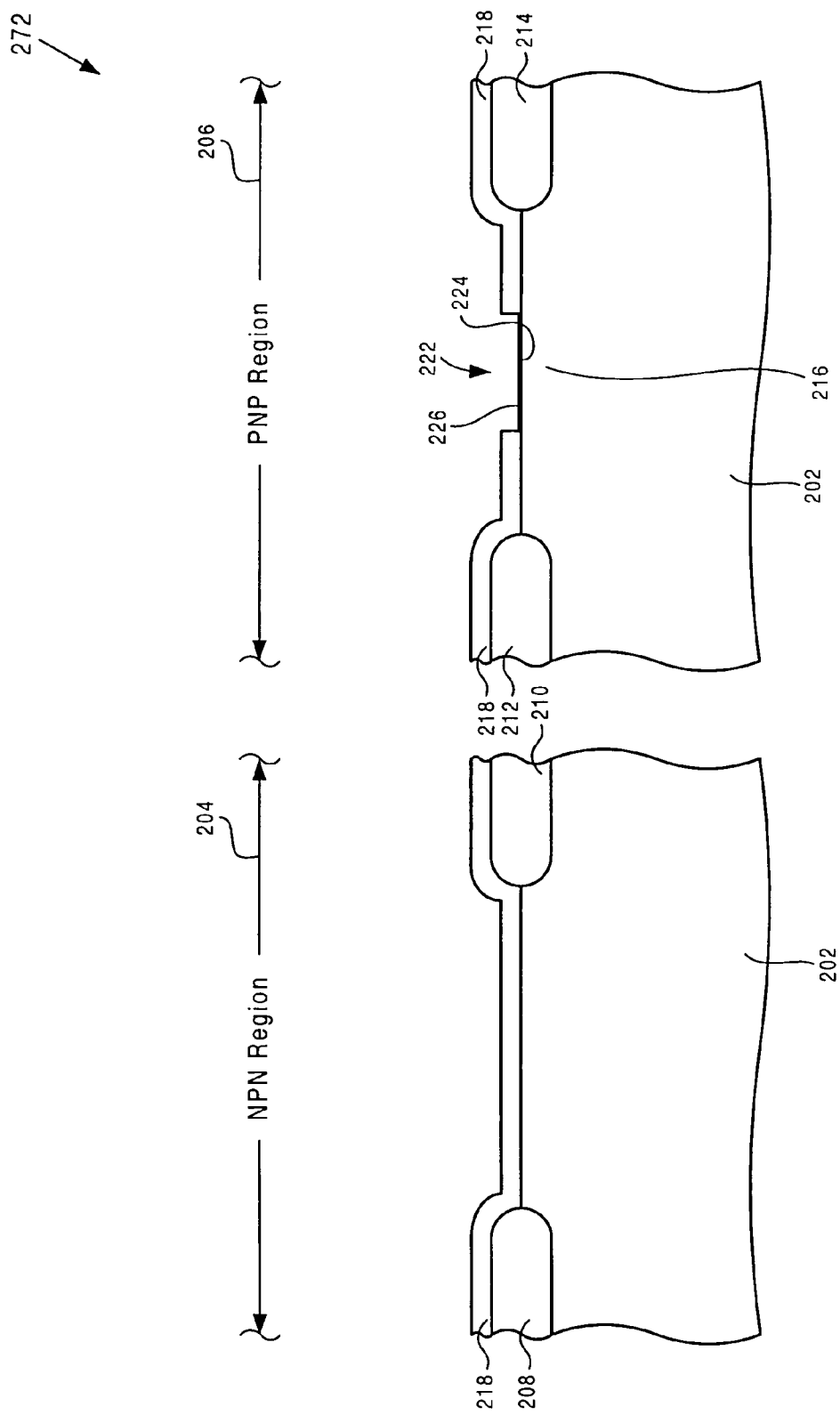
FIG. 2B illustrates cross-sectional views, which include portions of a wafer processed according to an embodiment of the invention, corresponding to certain steps of the flowchart in FIG. 1.

Referring to step 172 in FIG. 1 and structure 272 in FIG. 2B, at step 172 of flowchart 100, emitter window opening 222 is extended by removing a portion of insulating layer 218 situated in emitter window opening 222. The portion of insulating layer 218 in emitter window opening 222 can be removed by using an appropriate etch process such that portion 224 of substrate 202 is exposed. Also at step 172 of flowchart 100, interfacial oxide layer 226 is formed on portion 224 of substrate 202 in emitter window opening 222. Interfacial oxide layer 226 can be formed on portion 224 of substrate 202 by using a rapid thermal oxidation ("RTO") process. By way of example, interfacial oxide layer 226 can have a thickness of between approximately 5.0 Angstroms and approximately 10.0 Angstroms.

Further at step 172 of flowchart 100, masking layer 220 in FIG. 2A can be removed, i.e. stripped, by using an appropriate etch process. In the present embodiment, a P type collector (not shown in any of the figures) is formed under base 216 prior to deposition of insulating layer 218. In one embodiment, a collector may be formed under base 216 by appropriately implanting a P type dopant in emitter window opening 222. The result of step 172 of flowchart 100 is illustrated by structure 272 in FIG. 2B.

Figure 2C:
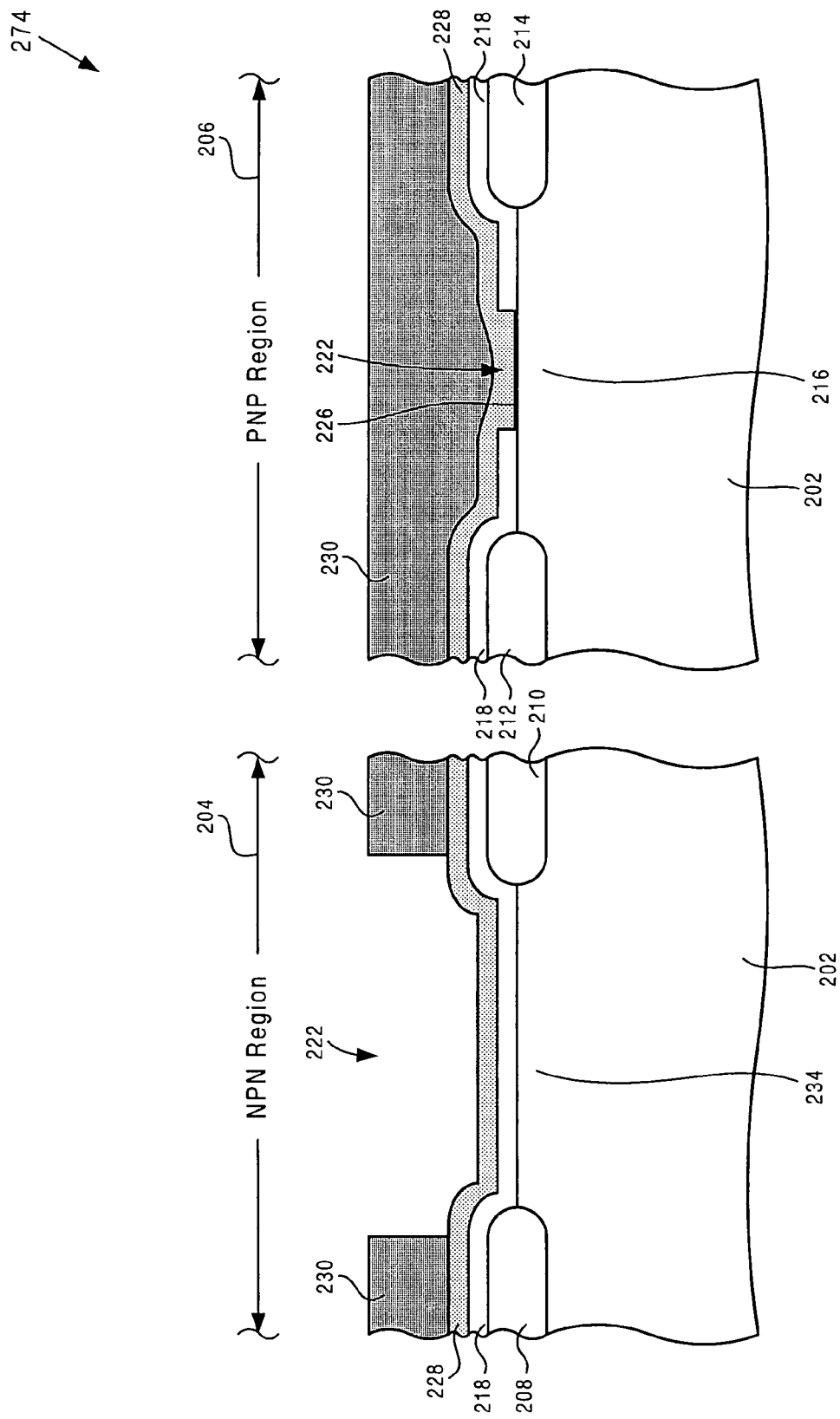
FIG. 2C illustrates cross-sectional views, which include portions of a wafer processed according to an embodiment of the invention, corresponding to certain steps of the flowchart in FIG. 1.

Referring to step 174 in FIG. 1 and structure 274 in FIG. 2C, at step 174 of flowchart 100, buffer layer 228 is formed on insulating layer 228 in NPN and PNP regions 204 and 206 and in emitter window opening 222. Buffer layer 228 can comprise amorphous silicon and can be conformally formed on insulating layer 228 and in emitter window opening 222 by using a CVD process or other appropriate processes. In one embodiment, buffer layer 228 can comprise polycrystalline silicon. By way of example, buffer layer 228 can have a thickness of approximately 500.0 Angstroms.

Also at step 174 of flowchart 100, masking layer 230 is formed over buffer layer 228 in NPN and PNP regions 204 and 206 and opening 232 is patterned in masking layer 230 in NPN region 204. Opening 232 is situated over active area 234 of substrate 202 in NPN region 204. Masking layer 230, which protects PNP region 206, can comprise photoresist or other masking material and can be appropriately patterned to form opening 232. The result of step 174 of flowchart 100 is illustrated by structure 274 in FIG. 2C.

Figure 2D:
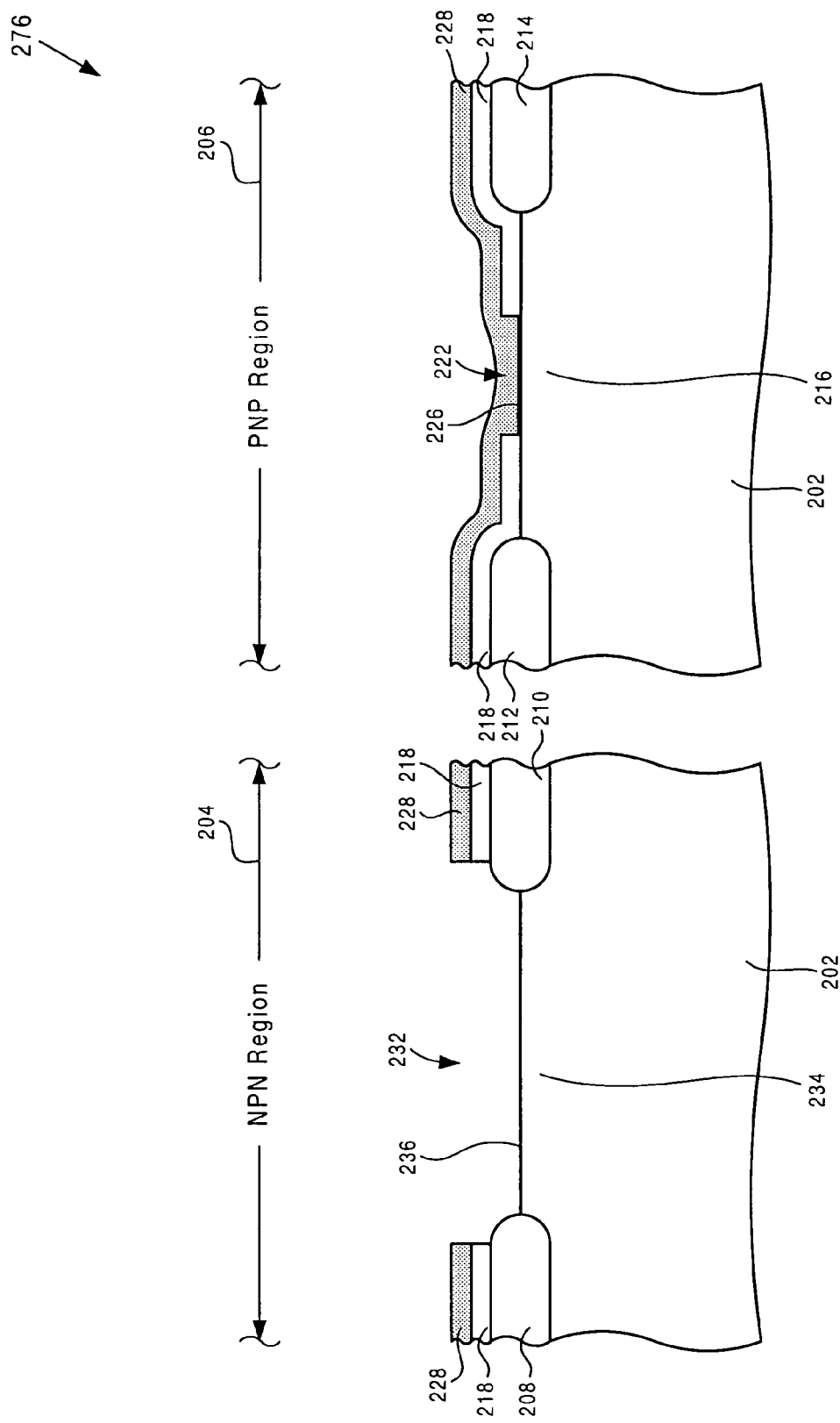
FIG. 2D illustrates cross-sectional views, which include portions of a wafer processed according to an embodiment of the invention, corresponding to certain steps of the flowchart in FIG. 1.

Referring to step 176 in FIG. 1 and structure 276 in FIG. 2D, at step 176 of flowchart 100, opening 232 in NPN region 204 is extended by removing portions of buffer layer 228 and insulating layer 218 in opening 232. Portions of buffer layer 228 and insulating 218 in opening 232 can be removed by using an appropriate etch process such that portion 236 of substrate 202 and portions of field oxide regions 208 and 210 are exposed. Also at step 176 of flowchart 100, masking layer 230 in FIG. 2C is removed in NPN and PNP regions 204 and 206. Masking layer 230 can be removed, i.e. stripped, by using an appropriate etch process. The result of step 176 of flowchart 100 is illustrated by structure 276 in FIG. 2D.

Figure 2E:
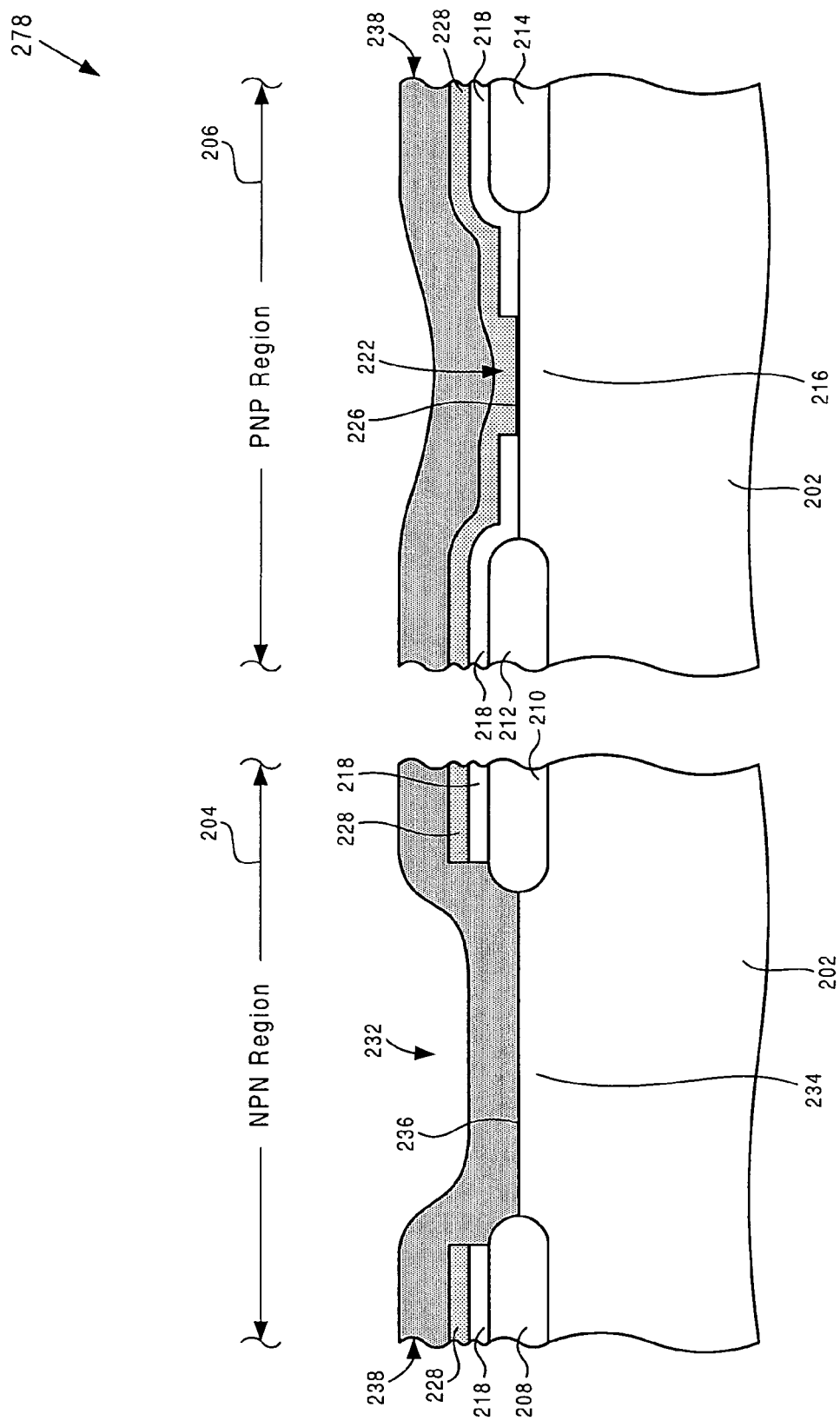
FIG. 2E illustrates cross-sectional views, which include portions of a wafer processed according to an embodiment of the invention, corresponding to certain steps of the flowchart in FIG. 1.

Referring to step 178 in FIG. 1 and structure 278 in FIG. 2E, at step 178 of flowchart 100, semiconductor layer 238 is formed over buffer layer 228 in respective NPN and PNP regions 204 and 206 and over exposed portions of field oxide regions 208 and 210 and surface portion 236 of substrate 202 in opening 232 in NPN region 204. Semiconductor layer 238 comprises silicon-germanium, which can be doped with a P type dopant. Semiconductor layer 238 can be formed by using an appropriate deposition process such that semiconductor layer 238 is epitaxial, i.e. single crystal, over exposed areas of silicon, such as portion 236 of substrate 202, and polycrystalline over buffer layer 228 in respective NPN and PNP regions 204 and 206. Thus, in the present invention, a portion of semiconductor layer 238 situated on portion 236 of substrate 202 can be utilized to form a single crystal base of a SiGe NPN device and a portion of semiconductor layer 238 situated on buffer layer 228 and situated over emitter window opening 222 can be utilized to form a polycrystalline emitter of a vertical PNP device.

Thus, in the present invention, buffer layer 228 insures that a portion of semiconductor layer 238, which is deposited on buffer layer 228 in PNP region 206, is polycrystalline while a portion of semiconductor layer 238, which is deposited on surface portion 236 of substrate 202, is single crystal. Thus, by utilizing buffer layer 228, the present invention can advantageously achieve a single crystal NPN base and a polycrystalline vertical PNP emitter in a single deposition process. The result of step 178 of flowchart 100 is illustrated by structure 278 in FIG. 2E.

Figure 2F:
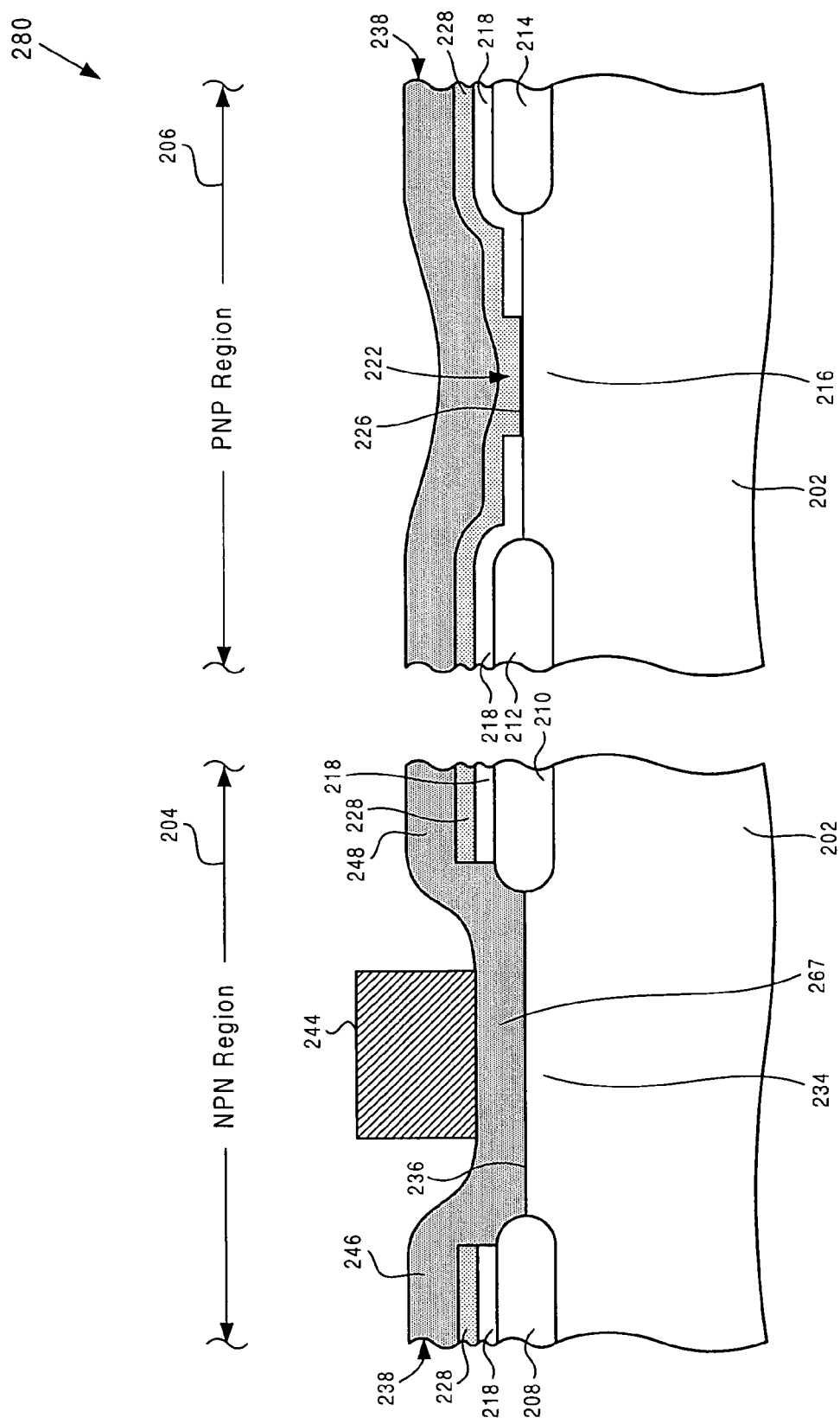
FIG. 2F illustrates cross-sectional views, which include portions of a wafer processed according to an embodiment of the invention, corresponding to certain steps of the flowchart in FIG. 1.

Referring to step 180 in FIG. 1 and structure 280 in FIG. 2F, at step 180 of flowchart 100, emitter 244, i.e. an NPN emitter, is formed over single crystal portion 267 of semiconductor layer 238 in NPN region 204. Emitter 244 can comprise polycrystalline silicon, i.e. polysilicon, and can be formed over portion 240 of semiconductor layer 238 by depositing a layer of polysilicon over semiconductor layer 238 and appropriately patterning and etching the layer of polysilicon in NPN region 204. Also at step 180 of flowchart 100, a P type dopant is implanted in semiconductor layer 238 to form extrinsic base regions 246 and 248 in NPN region 204 and a P type emitter in PNP region 206. During implantation of the P type dopant, emitter 244 in NPN region 204 is protected by a masking layer (not shown in FIG. 2F), which is utilized in the formation of emitter 244. The masking layer (not shown in FIG. 2F) can be removed by an appropriate etch process after the P type dopant has been implanted in semiconductor layer 238 in respective NPN and PNP regions 204 and 206. The result of step 180 of flowchart 100 is illustrated by structure 280 in FIG. 2F.

Figure 2G:
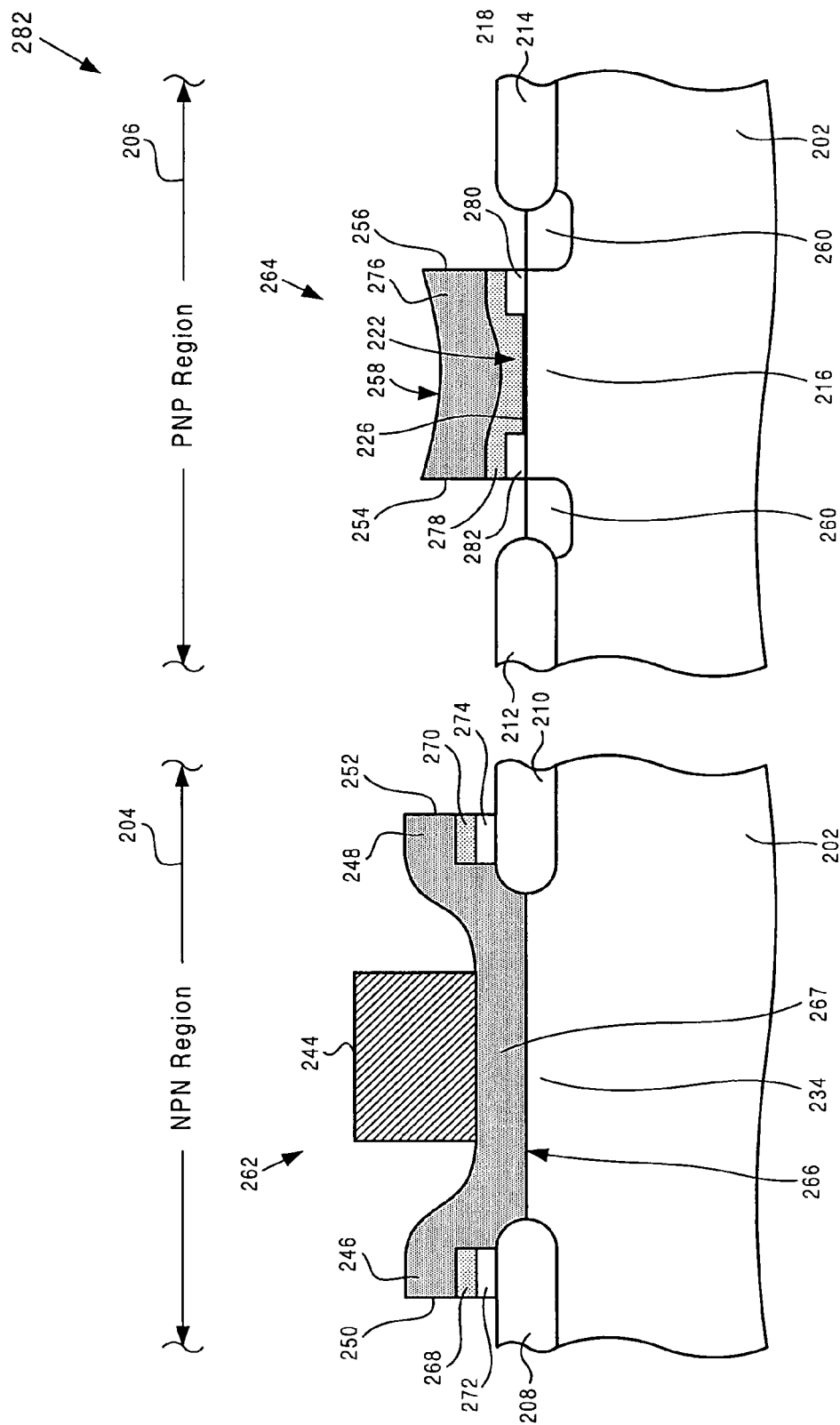
FIG. 2G illustrates cross-sectional views, which include portions of a wafer processed according to an embodiment of the invention, corresponding to certain steps of the flowchart in FIG. 1.

Referring to step 182 in FIG. 1 and structure 282 in FIG. 2G, at step 182 of flowchart 100, edges 250 and 252 of respective extrinsic base regions 246 and 248 in NPN region 204 and edges 254 and 256 of emitter 258 in PNP region 206 are defined. Edges 250 and 252 of respective extrinsic base regions 246 and 248 and edges 254 and 256 of emitter 258 can be defined by appropriately forming a mask over semiconductor layer 238 in NPN region 204 and PNP region 206 and removing unmasked portions of semiconductor layer 238, buffer layer 228, and insulating layer 218 in an appropriate etch process. Thus, in the present invention, the edges of extrinsic base regions in the NPN region and the edges of an emitter in the PNP region are simultaneously defined in the same masking and etching steps.

Also at step 182 of flowchart 100, N type regions 260 are formed adjacent to emitter 258 in PNP region 206. N type regions 260 can be formed by implanting an N type dopant in substrate 202 adjacent to sidewalls 254 and 256 of emitter 258. Metal contacts can be formed on N type regions 260 to allow base 216 to be contacted. As a result of the present invention's bipolar complementary process, NPN device 262, which is a SiGe NPN device, is formed in NPN region 204 of substrate 202 and vertical PNP device 264 is formed in PNP region 206 of substrate 202. NPN device 262 includes emitter 244, base 266, which comprises single crystal portion 267 of semiconductor layer 238, and is situated under emitter 244. NPN device 262 also includes a collector (not shown in FIG. 2G), which is situated under base 266 in substrate 202. NPN device 262 further includes extrinsic base regions 246 and 248, which are situated over respective portions 268 and 270 of buffer layer 228 and respective portions 272 and 274 of insulating layer 218.

Vertical PNP device 264 includes emitter 258, base 216, which is situated under emitter 258, and a collector (not shown in FIG. 2G), which is situated under base 216 in substrate 202. Emitter 258 comprises polycrystalline portion 276 of semiconductor layer 238, which is situated over segment 278 of buffer layer 228. Segment 278 of buffer layer 228 is situated over segments 280 and 282 of insulating layer 218 and interfacial oxide layer 226. Interfacial oxide layer 226 will decompose during a subsequent high temperature anneal process, which is utilized to anneal implant damage and simultaneously diffusion dopants in emitter 244 in NPN device 262 and emitter 258 in vertical PNP device 264.

Thus, as discussed above, by depositing a buffer layer over respective NPN and PNP regions of a substrate, the present invention advantageously achieves a single crystal silicon-germanium base of an NPN device and a polycrystalline silicon-germanium emitter of a vertical PNP device in a single deposition process. Furthermore, in the present invention, the edges of extrinsic base regions in the NPN region and the edges of an emitter in the PNP region are simultaneously defined in the same masking and etching steps. Thus, the present invention effectively integrates a SiGe NPN device and a vertical PNP device in a complementary bipolar process having reduced processing steps and, consequently, reduced manufacturing cost.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for integrating SiGe NPN and vertical PNP devices on a substrate and related structure have been described.

The invention claimed is:

1. A structure comprising:
an insulating layer situated over an NPN region and a PNP region of a substrate;
a buffer layer situated on said insulating layer;
an opening in said buffer layer and said insulating layer in said NPN region;
a semiconductor layer situated on said buffer layer and in said opening, said semiconductor layer having a first portion situated in said opening and a second portion situated on said buffer layer in said PNP region;
wherein said first portion of said semiconductor layer forms a base of an NPN device and said second portion of said semiconductor layer forms an emitter of a PNP device.

2. The structure of claim 1 further comprising an emitter window opening in said insulating layer in said PNP region, said buffer layer being situated in said emitter window opening.

3. The structure of claim 1 wherein said semiconductor layer comprises silicon-germanium.

4. The structure of claim 1 further comprising an emitter of said NPN device, said emitter of said NPN device being situated over said base.

5. The structure of claim 2 further comprising an interfacial oxide layer, said interfacial oxide layer being situated between said buffer layer and said substrate in said emitter window opening.

6. The structure of claim 1 wherein said insulating layer comprises TEOS oxide.

7. The structure of claim 1 wherein said buffer layer comprises amorphous silicon.

8. A structure comprising:
a first layer situated over an NPN region and a PNP region of a substrate;
a buffer layer situated on said first layer;
an opening in said buffer layer and said first layer in said NPN region;
a second layer situated on said buffer layer and in said opening, said second layer having a first portion situated in said opening and a second portion situated on said buffer layer in said PNP region, wherein said first portion of said second layer forms a base of an NPN device and said second portion of said second layer forms an emitter of a PNP device;
an emitter window opening in said first layer in said PNP region.

9. The structure of claim 8, wherein said first layer is an insulating layer.

10. The structure of claim 8, wherein said second layer is a semiconductor layer.

11. The structure of claim 8, wherein said first layer is an insulating layer and said second layer is a semiconductor layer.

12. The structure of claim 8 wherein said buffer layer is situated in said emitter window opening.

13. The structure of claim 10 wherein said semiconductor layer comprises silicon-germanium.

14. The structure of claim 8 further comprising an emitter of said NPN device, said emitter of said NPN device being situated over said base.

15. The structure of claim 8 further comprising an interfacial oxide layer, said interfacial oxide layer being situated between said buffer layer and said substrate in said emitter window opening.

16. The structure of claim 9 wherein said insulating layer comprises TEOS oxide.

17. The structure of claim 8 wherein said buffer layer comprises amorphous silicon.

* * * * *